(12) United States Patent
Lee et al.

(10) Patent No.: US 9,070,889 B2
(45) Date of Patent: Jun. 30, 2015

(54) OLED DISPLAY HAVING ORGANIC AND INORGANIC ENCAPSULATION LAYERS, AND MANUFACTURING METHOD THEREOF

(75) Inventors: So-Young Lee, Yongin (KR); Yoon-Hyeung Cho, Yongin (KR); Min-Ho Oh, Yongin (KR); Byoung-Duk Lee, Yongin (KR); Sang-Hwan Cho, Yongin (KR); Yong-Tak Kim, Yongin (KR); Yun-Ah Chung, Yongin (KR); Seung-Yong Song, Yongin (KR); Jong-Hyuk Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 165 days.

(21) Appl. No.: 13/298,118

(22) Filed: Nov. 16, 2011

(65) Prior Publication Data
US 2012/0256202 A1 Oct. 11, 2012

(30) Foreign Application Priority Data

Apr. 11, 2011 (KR) ........................ 10-2011-0033395

(51) Int. Cl.
*H01L 51/50* (2006.01)
*H01L 51/52* (2006.01)
(Continued)

(52) U.S. Cl.
CPC .......... *H01L 51/448* (2013.01); *H01L 51/5237* (2013.01); *H01L 51/5246* (2013.01);
(Continued)

(58) Field of Classification Search
CPC . H01L 51/448; H01L 23/564; H01L 23/3135; H01L 23/31; H01L 23/3121; H01L 27/32; H01L 33/52; H01L 33/54; H01L 33/56
USPC ...................... 438/99, 126, 127; 257/40, 790
See application file for complete search history.

(56) References Cited

U.S. PATENT DOCUMENTS

| 6,038,008 A | 3/2000 | Kim et al. |
| 6,413,645 B1 | 7/2002 | Graff et al. |

(Continued)

FOREIGN PATENT DOCUMENTS

| JP | 2007-073355 | 3/2007 |
| KR | 10-2002-0080067 A | 10/2002 |

(Continued)

OTHER PUBLICATIONS

U.S. Office action dated Dec. 23, 2013, for cross reference U.S. Appl. No. 13/297,133, (17 pages).

*Primary Examiner* — Evan Pert
(74) *Attorney, Agent, or Firm* — Christie, Parker & Hale, LLP

(57) ABSTRACT

An organic light emitting diode (OLED) display a includes: a substrate; an organic light emitting element on the substrate and including a first electrode, a light emission layer, and a second electrode; and an encapsulation layer on the substrate while covering the organic light emitting element. The encapsulation layer includes an organic layer and an inorganic layer. A mixed area, where organic materials forming the organic layer and inorganic materials forming the inorganic layer co-exist along a plane direction of the encapsulation layer, is formed at the boundary between the organic layer and the inorganic layer.

18 Claims, 8 Drawing Sheets

(51) Int. Cl.
   *H01L 51/44* (2006.01)
   *H01L 23/31* (2006.01)
   *H01L 33/54* (2010.01)
   *H01L 51/54* (2006.01)

(52) U.S. Cl.
   CPC ........ *H01L51/5256* (2013.01); *H01L 51/5275* (2013.01); *H01L 23/31* (2013.01); *H01L 33/54* (2013.01); *H01L 2924/0002* (2013.01)
   USPC ............... 257/40; 438/99; 438/126; 438/127; 257/790

(56) References Cited

U.S. PATENT DOCUMENTS

| | | | |
|---|---|---|---|
| 6,969,634 | B2 | 11/2005 | Bao |
| 7,133,100 | B2 | 11/2006 | Ahn |
| 7,205,565 | B2 | 4/2007 | Im et al. |
| 7,473,932 | B2 | 1/2009 | Cho et al. |
| 7,906,898 | B2 | 3/2011 | Lee |
| 8,168,984 | B2 | 5/2012 | Lin et al. |
| 8,455,282 | B2 | 6/2013 | Kim et al. |
| 8,569,951 | B2 * | 10/2013 | Ryu et al. ................. 313/512 |
| 8,638,032 | B2 | 1/2014 | Maindron et al. |
| 2004/0263740 | A1 | 12/2004 | Sakakura et al. |
| 2005/0026454 | A1 | 2/2005 | Konishi et al. |
| 2007/0159094 | A1 | 7/2007 | Oh et al. |
| 2007/0166851 | A1 | 7/2007 | Tran et al. |
| 2007/0290607 | A1 | 12/2007 | Okada et al. |
| 2007/0291200 | A1 | 12/2007 | Tashiro et al. |
| 2008/0157065 | A1 | 7/2008 | Krishnamoorthy et al. |
| 2008/0305360 | A1 * | 12/2008 | Han et al. ................. 428/690 |
| 2009/0137178 | A1 | 5/2009 | Sakakura et al. |
| 2009/0202743 | A1 | 8/2009 | Schaepkens et al. |
| 2010/0136728 | A1 | 6/2010 | Horng et al. |
| 2010/0320909 | A1 | 12/2010 | Izumi |
| 2011/0114931 | A1 | 5/2011 | Lee et al. |
| 2011/0121355 | A1 | 5/2011 | Bae et al. |
| 2011/0121469 | A1 | 5/2011 | Blander et al. |
| 2011/0171764 | A1 * | 7/2011 | Toonen et al. ................. 438/29 |
| 2011/0175073 | A1 | 7/2011 | Chang |
| 2011/0272682 | A1 | 11/2011 | Blizzard et al. |
| 2011/0277653 | A1 | 11/2011 | Nguyen |
| 2012/0139000 | A1 | 6/2012 | Lee et al. |
| 2012/0155093 | A1 | 6/2012 | Yamada et al. |
| 2012/0199872 | A1 * | 8/2012 | Chen et al. ................. 257/100 |
| 2012/0208306 | A1 * | 8/2012 | Haas et al. ................. 438/26 |
| 2012/0256202 | A1 | 10/2012 | Lee et al. |
| 2012/0286245 | A1 | 11/2012 | Levermore et al. |
| 2012/0326131 | A1 * | 12/2012 | Han ................. 257/40 |
| 2012/0326192 | A1 | 12/2012 | Van Slyke et al. |
| 2013/0175710 | A1 | 7/2013 | Sakakura et al. |
| 2013/0244079 | A1 | 9/2013 | Mandlik et al. |

FOREIGN PATENT DOCUMENTS

| | | |
|---|---|---|
| KR | 10-2005-0048133 A | 5/2005 |
| KR | 10-2005-0117255 A | 12/2005 |
| KR | 10-2006-0031487 A | 4/2006 |
| KR | 10-2008-0087257 A | 10/2008 |
| KR | 10-2010-0027902 A | 3/2010 |

* cited by examiner

OLED DISPLAY HAVING ORGANIC AND INORGANIC ENCAPSULATION LAYERS, AND MANUFACTURING METHOD THEREOF

CROSS-REFERENCE TO RELATED APPLICATION

This application claims priority to and the benefit of Korean Patent Application No. 10-2011-0033395, filed in the Korean Intellectual Property Office on Apr. 11, 2011, the entire content of which is incorporated herein by reference.

BACKGROUND

1. Field

The described technology relates generally to an organic light emitting diode (OLED) display. More particularly, the described technology relates generally to an OLED display provided with an encapsulation layer to protect an organic light emitting element from external moisture and oxygen, and a manufacturing method thereof.

2. Description of Related Art

Organic light emitting diode displays are typical displays that emit light by themselves and have small thickness and weight, because they do not need independent light sources, and also have excellent or desired characteristics, such as small power consumption, high luminance, and high response speed.

A plurality of organic light emitting elements, each formed of a first electrode, a second electrode, and a light emission layer disposed between the first and second electrodes, are disposed in a display portion of the OLED display. Since a display function and a life-span characteristic are deteriorated when the organic light emitting element is exposed to external moisture and oxygen, an encapsulation layer is formed on the display portion to seal the display portion. The encapsulation layer may have a multilayer structure formed by alternatively layering organic layers and inorganic layers several times.

The above information disclosed in this Background section is only for enhancement of understanding of the background of the described technology and therefore it may contain information that does not form the prior art that is already known in this country to a person of ordinary skill in the art.

SUMMARY

The described technology is directed toward an effort to provide an organic light emitting diode (OLED) display with an encapsulation layer having an improved sealing function by improving structures of organic and inorganic layers forming the encapsulation layer, and a manufacturing method thereof.

An OLED display according to an exemplary embodiment includes: a substrate; an organic light emitting element formed on the substrate and including a first electrode, a light emission layer, and a second electrode; and an encapsulation layer formed on the substrate while covering the organic light emitting element. The encapsulation layer includes an organic layer and an inorganic layer. Also, a mixed area, where organic materials forming the organic layer and inorganic materials forming the inorganic layer co-exist along a plane direction of the encapsulation layer, is formed at the boundary between the organic layer and the inorganic layer.

The organic layer may have a plurality of groove portions at a surface thereof, and the inorganic layer may be formed on the organic layer while concurrently filling the plurality of groove portions. The plurality of groove portions formed in the organic layer may be respectively separated from each other such that they may be independent from each other.

In the organic layer, the width of each of the groove portions may be in a range between 1 nm to 5 μm. In the organic layer, the depth of each of the groove portions may be in a range between 1 nm to 5 μm.

The organic layer may have a plurality of holes and the inorganic layer may be formed on the organic layer while concurrently filling the plurality of holes. In the organic layer, the plurality of holes may be separated from each other such that they may be independent from each other. The size of each hole formed in the organic layer may be in a range between 1 nm to 5 μm.

The organic layer may include at least one selected from a group consisting of an acryl-based resin, a methacrylate-based resin, polyisoprene, a vinyl-based resin, an epoxy-based resin, a urethane-based resin, a cellulose-based resin, and a perylene-based resin.

The inorganic layer may include at least one selected from a group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxide nitride.

The organic layer and the inorganic layer may be respectively provided in plural, and the mixed area may be formed at each boundary in the layering of the inorganic layer on the organic layer.

A manufacturing method of an OLED display according to another exemplary embodiment includes: forming an organic light emitting element to include a first electrode, a light emission layer, and a second electrode on a substrate and forming an encapsulation layer on the organic light emitting element. The forming of the encapsulation layer includes: forming an organic layer to include organic materials and etching target particles; forming a plurality of groove portions in the organic layer by selectively etching the etching target particles; and filling the plurality of groove portions with inorganic materials by forming an inorganic layer on the organic layer.

The etching target particles may include at least one of organic colloid particles, inorganic colloid particles, and metal colloid particles. The etching target particles may include carbon nanotubes.

In the forming of the organic layer, the etching target particles may be evenly dispersed to the organic materials through a dispersion process.

In the forming of the plurality of groove portions, the etching target particles may be etched through plasma etching. In the forming of the groove portions, the organic layer may form at least one hole.

The OLED display according to an embodiment of the present invention prevents or protects from a layer falling-off phenomenon by enhancing a bonding force between the organic layer and the inorganic layer forming the encapsulation layer, and suppresses penetration of external moisture and oxygen along the boundary between the organic layer and the inorganic layer to thereby improve a sealing function of the encapsulation layer. Further, the OLED display can increase a light extracting efficiency by reducing internal reflection at the boundary between the organic layer and the inorganic layer, and can suppress reflection of external light by refracting the external light.

DETAILED DESCRIPTION

Figure 1:
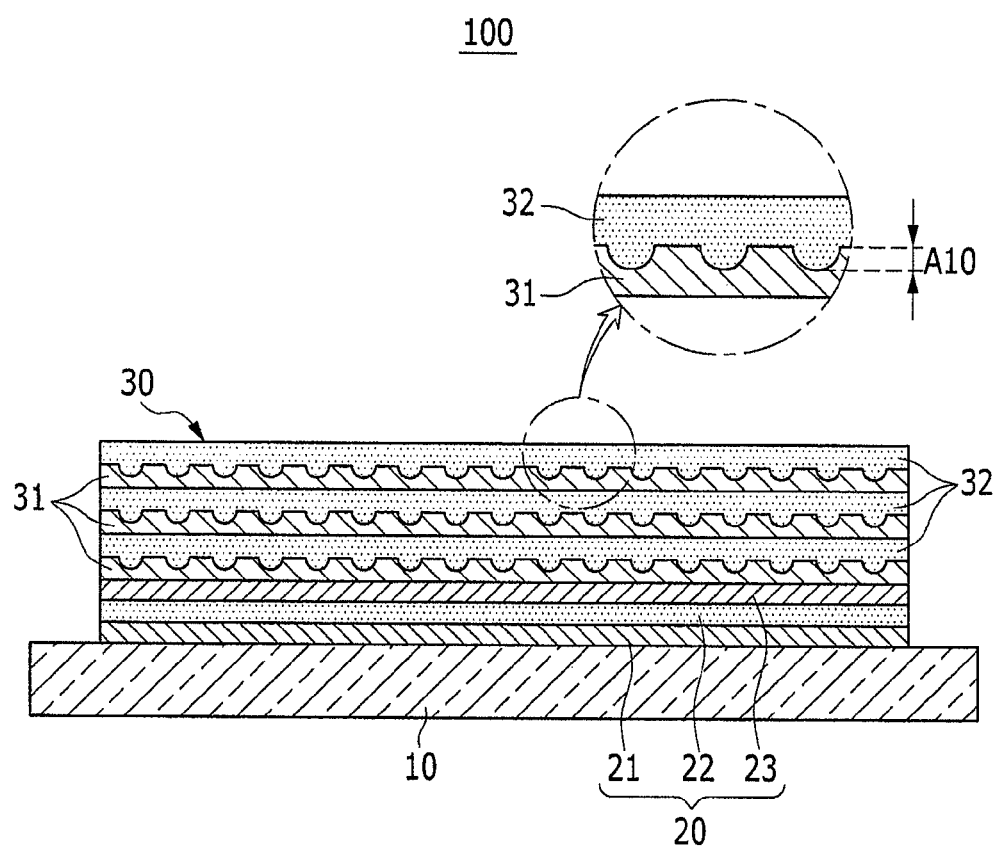
FIG. 1 is a schematic cross-sectional view of an OLED display according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, regions, etc., are exaggerated for clarity. It will be understood that when an element such as a layer, film, region, or substrate is referred to as being "on" another element, it can be directly on the other element, or one or more intervening elements may be present therebetwen. By contrast, it will be understood that when an element is referred to as being "directly on" another element, intervening elements are not present.

FIG. 1 is a schematically cross-sectional view of an organic light emitting diode (OLED) display according to an exemplary embodiment.

Referring to FIG. 1, an organic light emitting diode (OLED) display 100 includes a substrate 10, an organic light emitting element 20 formed on the substrate 10, and an encapsulation layer 30 formed on the substrate 10 while covering the organic light emitting element 20. The organic light emitting element 20 includes a first electrode 21, an emission layer 22, and a second electrode 23. The encapsulation layer 30 includes an organic layer 31 and an inorganic layer 32, and a mixed area A10 is disposed at the boundary between the organic layer 31 and the inorganic layer 32.

The substrate 10 may be a glass substrate or a plastic substrate. The substrate 10 may be formed with a glass or plastic material having excellent, desired or suitable mechanical strength, thermal stability, transparency, surface flatness, and/or water-resistance. A barrier layer may be disposed on the substrate 10 for blocking moisture and oxygen. The barrier layer may be formed with one inorganic layer and one organic layer or multiple layerings of the inorganic and organic layers.

The organic light emitting element 20 is disposed on the substrate 10. The organic light emitting element 20 has a structure in which the first electrode 21, the emission layer 22, and the second electrode 23 are layered. One of the first electrode 21 and the second electrode 23 functions as a hole injection electrode, and the other functions as an electron injection electrode.

The first electrode 21 and the second electrode 23 may be a transparent electrode, a transflective electrode, or a reflective electrode. When the first electrode 21 is a transparent electrode and the second electrode 23 is a reflective electrode, light emitted from the emission layer 22 is reflected by the second electrode 23 and emitted to the outside after passing through the first electrode 21 and the substrate 10. On the contrary, when the first electrode 21 is a reflective electrode and the second electrode 23 is a transparent electrode, light emitted from the emission layer 22 is reflected by the first electrode 21 and then emitted to the outside after passing through the second electrode 23 and the encapsulation layer 30.

Not only the emission layer 22, but also at least one of a hole injection layer (HIL), a hole transport layer (HTL), an electron transport layer (ETL), and an electron injection layer (EIL) may be formed between the first electrode 21 and the second electrode 23. When a driving voltage is applied to the first electrode 21 and the second electrode 23, electrons and holes are injected to the emission layer 22 and excitons are generated from combination of the injected electrons and holes, and light is emitted when the excitons drop from the excited stated to the ground state.

Substantially, a plurality of organic light emitting elements are disposed on a display portion of the substrate 10. Each organic light emitting element is connected to a driving circuit including a thin film transistor and thus light emission of the organic light emitting element is controlled by the driving circuit. FIG. 1 schematically illustrates one organic light emitting element rather than illustrating the plurality of organic light emitting elements disposed on the display portion, and illustration of the driving circuit is omitted for convenience of description.

The encapsulation layer 30 protects the organic light emitting element 20 from external moisture and oxygen by sealing the organic light emitting element 20. The encapsulation layer 30 includes a plurality of organic layers 31 and a plurality of inorganic layers 32, and the organic layers 31 and the inorganic layers 32 are alternately layered such that the encapsulation layer 30 is formed. The inorganic layer 32 prevents or protects from penetration of moisture and oxygen, and the organic layer 31 eases stress of the inorganic layer 32 and fills micro cracks and pin holes of the inorganic layer 32.

In the encapsulation layer 30, a plurality of boundaries between the respective organic layers 31 and the respective encapsulation layers 30 exist. The mixed area A10 where an organic material forming the organic layer 31 and an inorganic material forming the inorganic layer 32 are mixed along a plane direction of the encapsulation layer 30 is formed at at least one boundary of the plurality of boundaries. Here, the plane direction (the horizontal direction of FIG. 1) of the encapsulation layer 30 refers to a direction that is parallel with the surface of the organic layer 31 or the surface of the inorganic layer 32.

Figure 2:
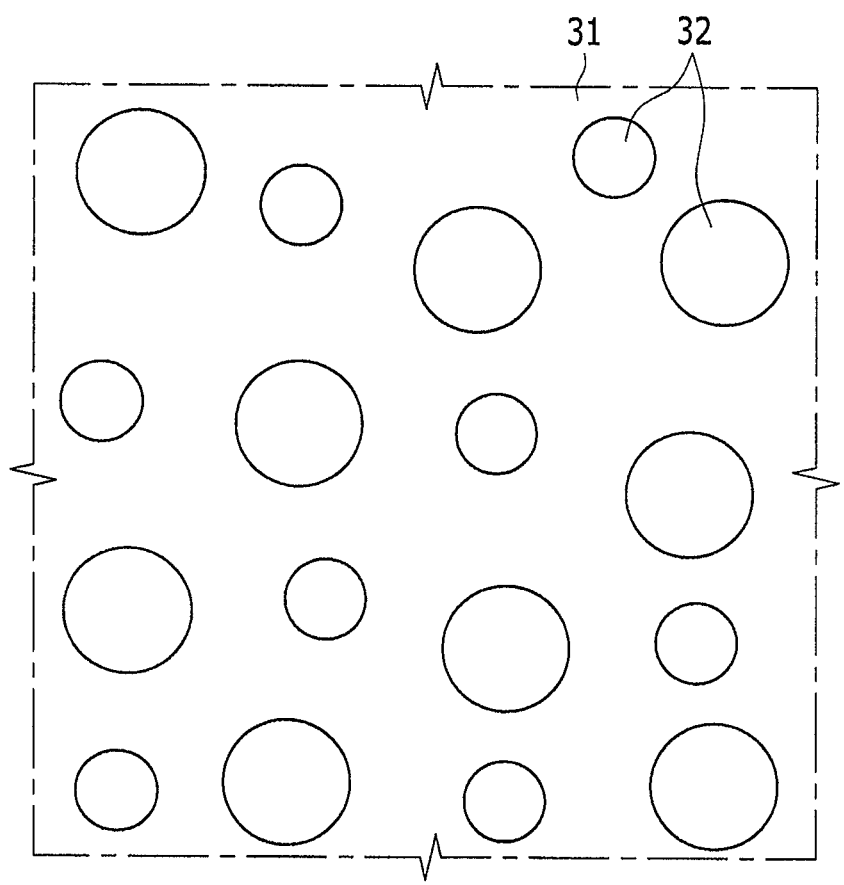
FIG. 2 is a top plan view of an organic layer in an encapsulation layer of FIG. 1.
Figure 3:
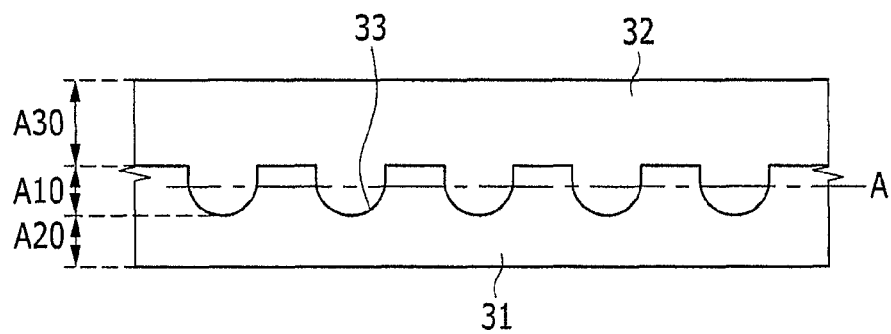
FIG. 3 is a partially enlarged view of the encapsulation layer of FIG. 1.

FIG. 2 is a top plan view of the organic layer in the encapsulation layer of FIG. 1, and FIG. 3 is a partially enlarged view of the encapsulation layer of FIG. 1.

Referring to FIG. 1 to FIG. 3, a plurality of groove portions 33 are formed at the surface of the organic layer 31. The plurality of groove portions 33 are formed independently from each other. That is, each the groove portions 33 is formed in the shape of a fine dot rather than being arranged along one direction.

Each of the plurality of grooves 33 may be formed in the shape of a circle, an oval, a polygon, and the like, and the shape thereof is not restrictive. At least one groove portion 33 of the plurality of groove portions 33 may be different from the other groove portion 33 in size, shape, or depth. The plurality of groove portions 33 may be regularly arranged or irregularly arranged. Although the plurality of groove portions 33 are irregularly arranged, a distance between the respective groove portions 33 does not exceed a predetermined or set deviation.

The inorganic layer 32 is formed above the organic layer 31 while concurrently (at the same time) filling the plurality of groove portions 33 formed on the organic layer 31. Thus, the inorganic layer 32 is partially formed in the shape of a protrusion that completely fills the plurality of grooves 33, and other parts of the inorganic layer 32 are formed in the shape of a layer having a constant thickness.

In observation of a cross-section of the encapsulation layer 30, the encapsulation layer 30 is divided into: an organic material area A20 (refer to FIG. 3) formed only with an organic material, a mixed area A10 where an organic material and an inorganic material exist in a mixed manner, and an inorganic area A30 formed only with an inorganic material. The organic material area A20, the mixed area A10, and the inorganic area A30 are arranged along a thickness direction (the vertical direction of FIG. 3) of the encapsulation layer 30. The thickness of the mixed area A10 may be equivalent to an average depth of the groove portions 33.

In the mixed area A10 of the encapsulation layer 30, the organic material forming the organic layer 31 and the inorganic material forming the inorganic layer 32 exist in a mixed manner along a plane direction of the encapsulation layer 30. Thus, the organic materials and the inorganic materials are alternately arranged along the plane direction (refer to the line A in FIG. 3) of the encapsulation layer 30, which penetrate at least two groove portions 33.

In the encapsulation layer 30, the organic layer 31 and the inorganic layer 32 are alternately arranged along the thickness direction of the encapsulation layer 30, and the organic materials and the inorganic materials are alternately arranged along two crossing directions among the plane directions of the encapsulation layer 30. The two crossing directions may be two directions that are perpendicular to each other (for example, the horizontal direction and the vertical direction of FIG. 2). Thus, the encapsulation layer 30 has a 3-D crossing network structure in which the organic materials and the inorganic materials are alternately arranged along three directions.

If both of the organic layer and the inorganic layer respectively have a consistent thickness and thus have no mixed area existing between the organic layer and the inorganic layer, then the organic layer and the inorganic layer may be separated due to a boundary formed therebetween, thereby causing a layer falling-off phenomenon. In addition, external moisture and oxygen penetrate into the encapsulation layer along the boundary of the organic layer and the inorganic layer so that a characteristic of the organic light emitting element may be deteriorated.

However, the encapsulation layer 30 in the present exemplary embodiment, makes the boundary between the organic layer 31 and the inorganic layer 32 tangled due to the 3-D crossing network structure of the organic layer 31 and the inorganic layer 32. Accordingly, the encapsulation layer 30 can prevent or protect from the layer falling-off phenomenon by enhancing a bonding force between the organic layer 31 and the inorganic layer 32, and can suppress penetration of the external moisture and oxygen along the boundary between the organic layer 31 and the inorganic layer 32.

The width of the groove portion 33 may be in a range between 1 nm to 5 μm, and the depth of the groove portion 33 may be in a range between 1 nm to 5 μm. In one embodiment, when the width and the depth of the groove portion 33 are respectively less than 1 nm, a weak 3-D crossing network structure is formed so that the bonding force between the organic layer 31 and the inorganic layer 32 is insignificantly enhanced. In another embodiment, when the width and the depth of the groove portion 33 respectively exceed 5 μm, dispersion of particles that are objects to be etched, is difficult during a manufacturing process of the OLED display. A distance between the groove portions 33 may be variously changed depending on a dispersion condition and a dispersion density of the organic layer 31.

Further, the organic layer 31 and the inorganic layer 32 both have roughness so that they cause refractive index variation, thereby improving light efficiency. In the case of a top emission type OLED display, internal reflection of light emitted from the organic light emitting element 20 is reduced at the boundary between the organic layer 31 and the inorganic layer 32 when passing through the encapsulation layer 30 so that light extraction efficiency can be increased. In addition, when external light is incident on the encapsulation layer, the external light is refracted at the boundary between the organic layer 31 and the inorganic layer 32 so that reflection of the external light can be suppressed. The light extraction efficiency implies luminance improvement of the screen, and suppression of the reflection of the external light improves contrast of the screen.

The organic layer 31 has a refractive index in a range between 1.2 to 2.0, and the inorganic layer 32 has a refractive index in a range between 1.3 to 2.2. In order to improve light extraction efficiency, a difference between the refractive indexes of the organic layer 31 and the inorganic layer 32 is set to be greater than 0.1, and the light extraction efficiency can be further improved as the refractive index difference between the organic layer 31 and the inorganic layer 32 is increased.

The organic layer 31 may include at least one of an acryl-based resin, a methacrylate-based resin, polyisoprene, a vinyl-based resin, an epoxy-based resin, a urethane-based resin, a cellulose-based resin, and a perylene-based resin. The plurality of organic layers 31 may include the same material or different materials. The organic layer 31 may form the plurality of groove portions 33 at the surface thereof using various suitable methods. A method for forming the groove portions 33 will be described in further detail later.

The inorganic layer 32 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxide nitride. The plurality of inorganic layer 32 may include the same material or different materials.

FIG. 1 exemplarily illustrates that the encapsulation layer 30 includes three organic layers 31 and three inorganic layers 32 and the mixed area A10 is disposed at each boundary between the corresponding organic layer 31 and the corresponding inorganic layer 32 layered right above the organic layer 31. However, the number and the location of the organic layer(s) 31 and the inorganic layer(s) 32, and a layering number of the mixed area A10, are not limited to the exemplary illustration. That is, they may be variously and suitably modified.

Figure 4:
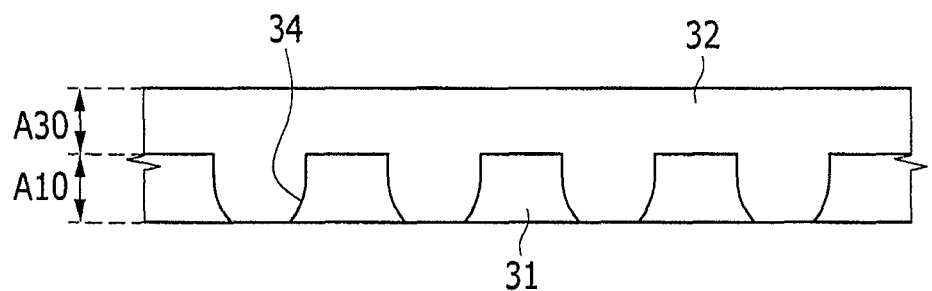
FIG. 4 is a partially enlarged view of an encapsulation layer of another exemplary embodiment of FIG. 3.

Also, either the plurality of groove portions 33 and a plurality of holes 34 may be formed together, or the plurality of holes 34 may be formed instead of the plurality of groove portions 33 in the organic layer 31. FIG. 4 exemplarily illustrates that the plurality of holes (e.g., through holes) 34 are formed in the organic layer 31.

Referring to FIG. 4, in observation of a cross-section of the encapsulation layer 30, the encapsulation layer 30 is divided into the mixed area A10 where the organic materials and the inorganic materials co-exist along the plane direction of the encapsulation layer 30, and the inorganic area A30 formed of only the inorganic materials. That is, the organic layer 31 is disposed together with the inorganic layer 32 in the mixed area A10 without having an organic material only area. Although the plurality of holes 34 are formed in the organic layer 31, the organic layer 31 can still maintain flatness of the encapsulation layer 30 and ease stress. Like the above-stated groove portion, the width of the respective holes in the organic layer 31 may be included in a range between 1 nm to 5 μm.

Hereinafter, a manufacturing method of an OLED display according to the present exemplary embodiment will be described.

A manufacturing method of an OLED display 100 according to the present exemplary embodiment includes forming an organic light emitting element 20 including a first electrode 21, an emission layer 22, and a second electrode 23 on a substrate 10 and forming an encapsulation layer 30 on the organic light emitting element 20. The forming of the encapsulation layer 30 includes a first step for forming an organic layer 31 including organic materials and particles to be etched, a second step for forming a plurality of groove portions 33 by selectively etching the particles included in the organic layer 31, and a third step for filling the plurality of groove portions 33 with inorganic material by forming an inorganic layer 32 on the organic layer 31.

Figure 5A:
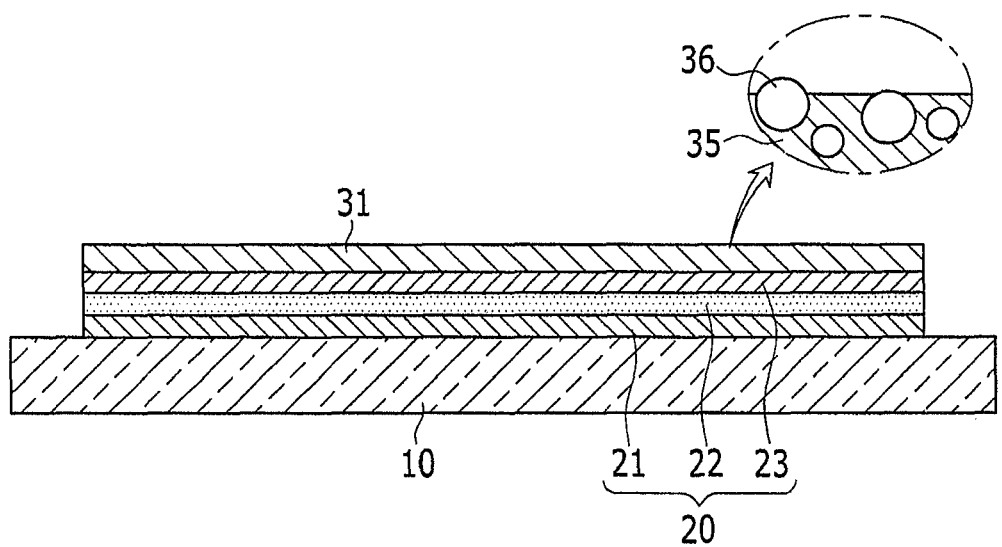
FIG. 5A to FIG. 5C are schematic cross-sectional views for describing a manufacturing method of an OLED display according to an exemplary embodiment.
Figure 5B:
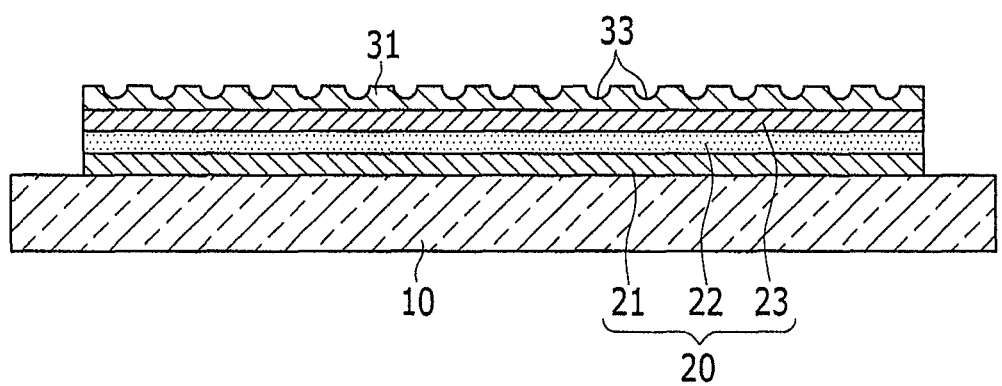
Figure 5C:
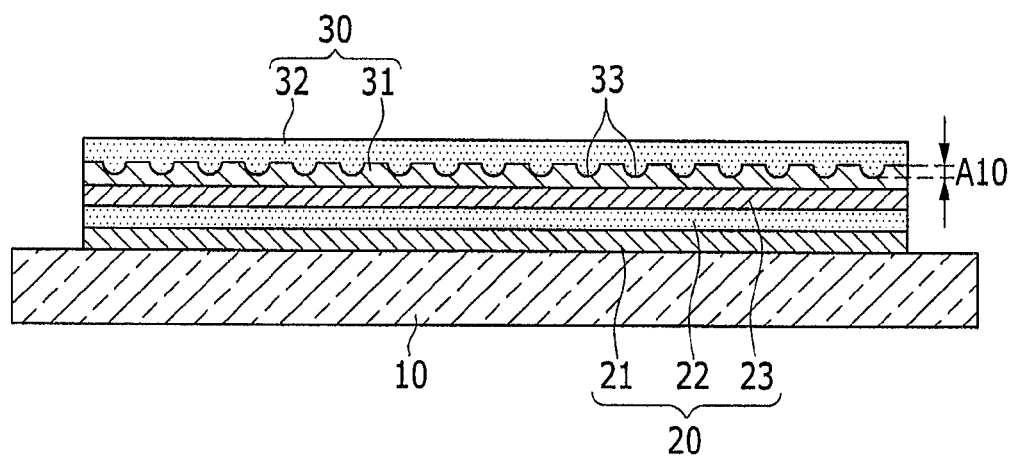

FIG. 5A to FIG. 5C are schematic cross-sectional views for describing a manufacturing method of an OLED display according to an exemplary embodiment.

Referring to FIG. 5A, an organic light emitting element 20 is formed on a substrate 10. The organic light emitting element 20 includes a first electrode 21, an emission layer 22, and a second electrode 23. A barrier layer may be disposed between the substrate 10 and the organic light emitting element 20, and a driving circuit including a thin film transistor is formed on the substrate 10. The driving circuit is connected with the organic light emitting element 20 and controls driving of the organic light emitting element 20.

Subsequently, an organic layer 31 is formed to cover the organic light emitting element 20 (first step). The organic layer 31 is formed with mixtures of particles 36 to be etched and organic materials 35. The organic layer 31 may be formed through a typical film formation process, for example, coating, heat treatment, vacuum deposition, and the like.

The organic material 35 and the particles 36 to be etched respectively have different etch rates with respect to a specific etchant. In further detail, with respect to the specific etchant, the particles 36 to be etched have a high etch rate, and the organic material 35 has a low etch rate. Thus, when the organic layer 31 is exposed to the etchant, the organic materials 35 in the organic layer 31 remain and the particles 36 to be etched are selectively etched.

The size of the particles 36 to be etched is equivalent to the width of the groove portion 33, and the particle content with respect to the organic materials 35 is determined depending on the density of groove portions 33 to be formed. The particles 36 to be etched may be organic colloid particles, inorganic colloid particles, metal colloid particles, or a carbon nanotube.

The organic colloid particles may include at least one of polystyrene, polymethylmethacrylate, and polyglycidylmethacrylate. The inorganic colloid particles may include at least one of $SiO_2$, $TiO_2$, ZnO, and ZrO. The metal colloid particles may include at least one of Cu, Ag, Au, and Fe.

The colloid particles are each sized to be between $10^{-5}$ cm to $10^{-7}$ cm. The colloid particles may have various functional groups for control of dispersive or electrostatic characteristics, and may exist in various suitable forms, including a monomer, a dimer, a trimer, and the like.

The particles 36 to be etched are evenly mixed to the organic materials 35 and then dispersed. In order to evenly mix the organic material 35 and the particles 36 to be etched, an ultrasonic wave device or a mechanical device such as a grinder may be used.

Referring to FIG. 5A and FIG. 5B, the particles 36 included in the organic layer 31 are selectively etched (second step). Then, the particles 36 to be etched are eliminated and a plurality of groove portions 33 are formed in the places of the eliminated particles 36. The selective etching may be performed using various methods, and for example, a plasma etching method may be used.

The plasma etching method uses radicals activated by plasma and electrons for etching. When the organic layer 31 is charged in the chamber and the etching method is applied, the etching target particles 36 included in the organic layer 31 can be selectively etched through continuous processes in the chamber by changing only a process condition such as an injection gas, a voltage applied thereto, and the like.

Since the etching target particles 36 are evenly dispersed in the first step, distances between the respective groove portions 33 do not exceed a set or predetermined deviation. Depending on the size of the etching target particles 36 included in the organic layer 31 and the thickness of the organic layer 31, either the plurality of groove portions 33 and a plurality of holes 34 may be formed together in the organic layer 31 after the selective etching, or the plurality of holes 34 may be formed instead of the plurality of groove portions 33.

Figure 6:
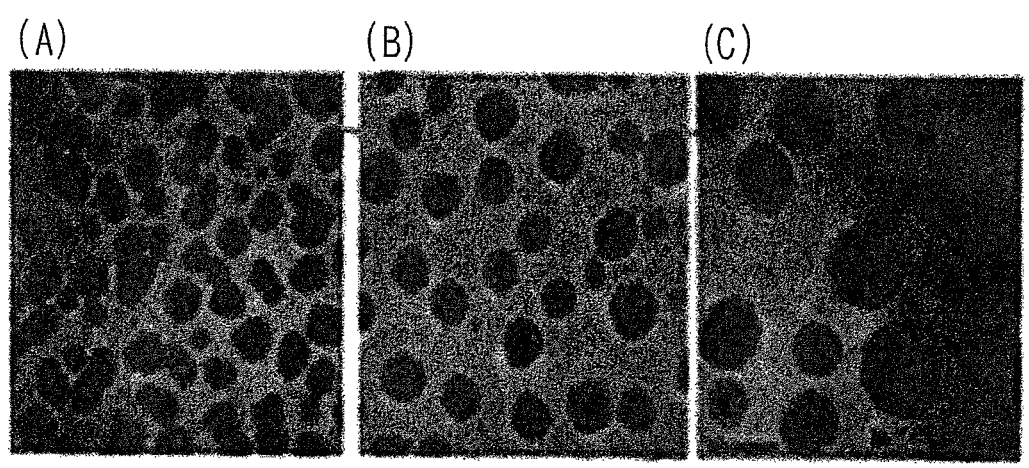
FIG. 6 is a scanning electron microscopy (SEM) showing an organic layer processed through a step shown in FIG. 5B.

As the organic material 35, a polypethylemethacrylate resin and silver (Ag) colloid particles are mixed in the first step, the silver colloid particles are selectively etched using the plasma etching method in the second step, and FIG. 6 is a SEM photo of the organic layer passing through the first and second steps. In FIG. 6, (A), (B), and (C) respectively show several groove portions completed by applying the silver (Ag) colloid particles with different sizes and different dispersion densities, respectively.

As shown in FIG. 6, it can be observed that, after passing through the first and second steps, the plurality of groove portions are formed in the shape of micro dots at the surface of the organic layer.

Referring to FIG. 5C, the plurality of groove portions 33 are filled with an inorganic material by forming the inorganic layer 32 on the organic layer 31 (third step). The inorganic layer 32 may be formed using a deposition or sputtering method. Accordingly, the mixed area A10, where the organic material and the inorganic material co-exist along the plane direction of the encapsulation layer 30, is formed between the organic layer 31 and the inorganic layer 32, and the organic material and the inorganic material form the 3-D crossing network structure.

By repeating the first to third steps at least once, the encapsulation layer 30 including the plurality of organic layers 31 and the plurality of inorganic layers 32 is formed (refer to FIG. 1). The OLED display 100, provided with such an encapsulation layer 30 according to the present exemplary embodiment, can prevent or protect from the layer falling off phenomenon of the encapsulation layer 30, can enhance a sealing function by blocking penetration of moisture and oxygen to the organic light emitting element 20, and can improve display quality by reducing reflection of internal and external lights.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of certain symbols> | |
|---|---|
| 100: OLED display | 10: substrate |
| 20: organic light emitting element | 21: first electrode |
| 22: emission layer | 23: second electrode |
| 30: encapsulation layer | 31: organic layer |
| 32: inorganic layer | 33: groove portion |
| 34: hole | 35: organic material |
| 36: object particles to be etched | |

What is claimed is:

1. An organic light emitting diode (OLED) display comprising:
a substrate;
an organic light emitting element on the substrate and comprising a first electrode, a light emission layer, and a second electrode; and
an encapsulation layer on the substrate while covering the organic light emitting element,
wherein the encapsulation layer comprises an organic layer and an inorganic layer,
wherein a mixed area, where organic materials forming the organic layer and inorganic materials forming the inorganic layer co-exist along a plane direction of the encapsulation layer, is formed at the boundary between the organic layer and the inorganic layer, and
wherein the organic layer has a plurality of groove portions at a surface thereof, and the inorganic layer is on the organic layer while concurrently filling the plurality of groove portions.

2. The OLED display of claim 1, wherein the plurality of groove portions formed in the organic layer are respectively separated from each other such that they are independent from each other.

3. The OLED display of claim 2, wherein, in the organic layer, the width of each of the groove portions is in a range between 1 nm to 5 μm.

4. The OLED display of claim 2, wherein, in the organic layer, the depth of each of the groove portions is in a range between 1 nm to 5 μm.

5. An organic light emitting diode (OLED) display comprising:
a substrate;
an organic light emitting element on the substrate and comprising a first electrode, a light emission layer, and a second electrode; and
an encapsulation layer on the substrate while covering the organic light emitting element,
wherein the encapsulation layer comprises an organic layer and an inorganic layer,
wherein a mixed area, where organic materials forming the organic layer and inorganic materials forming the inorganic layer co-exist along a plane direction of the encapsulation layer, is formed at the boundary between the organic layer and the inorganic layer, and
wherein the organic layer has a plurality of holes, and the inorganic layer is formed on the organic layer while concurrently filling the plurality of holes.

6. The OLED display of claim 5, wherein, in the organic layer, the plurality of holes are separated from each other such that they are independent from each other.

7. The OLED display of claim 6, wherein the size of each hole formed in the organic layer is in a range between 1 nm to 5 μm.

8. The OLED display of claim 1, wherein the organic layer comprises at least one selected from a group consisting of an acryl-based resin, a methacrylate-based resin, polyisoprene, a vinyl-based resin, an epoxy-based resin, a urethane-based resin, a cellulose-based resin, and a perylene-based resin.

9. The OLED display of claim 1, wherein the inorganic layer comprises at least one selected from a group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxide nitride.

10. The OLED display of claim 1, wherein the organic layer and the inorganic layer are respectively provided in plural, and the mixed area is formed at each boundary in layering of the inorganic layer on the organic layer.

11. A manufacturing method of an organic light emitting diode (OLED) display, the method comprising:
forming an organic light emitting element to include a first electrode, a light emission layer, and a second electrode on a substrate; and
forming an encapsulation layer on the organic light emitting element,
wherein the forming of the encapsulation layer comprises,
forming an organic layer to include a plurality of organic materials and a plurality of etching target particles;
forming a plurality of groove portions in the organic layer by selectively etching the etching target particles; and
filling the plurality of groove portions with inorganic materials by forming an inorganic layer on the organic layer.

12. The manufacturing method of claim 11, wherein the etching target particles comprise at least one of organic colloid particles, inorganic colloid particles, and metal colloid particles.

13. The manufacturing method of claim 11, wherein the etching target particles comprise carbon nanotubes.

14. The manufacturing method of claim 11, wherein, in the forming of the organic layer, the etching target particles are evenly dispersed to the organic materials through a dispersion process.

15. The manufacturing method of claim 11, wherein, in the forming of the plurality of groove portions, the etching target particles are etched through plasma etching.

16. The manufacturing method of claim 11, wherein, in the forming of the groove portions, the organic layer is formed to have at least one hole.

17. A manufacturing method of an organic light emitting diode (OLED) display, the method comprising:
forming an organic light emitting element to include a first electrode, a light emission layer, and a second electrode on a substrate; and
forming an encapsulation layer on the organic light emitting element,
wherein the forming of the encapsulation layer comprises,
forming an organic layer to include organic materials and etching target particles;
forming a plurality of holes in the organic layer by selectively etching the etching target particles; and
filling the plurality of holes with inorganic materials by forming an inorganic layer on the organic layer.

18. The OLED display of claim 1, wherein the organic layer has a plurality of holes, and the inorganic layer is formed on the organic layer while concurrently filling the plurality of holes.

* * * * *